United States Patent

Diekmann et al.

(10) Patent No.: US 9,224,974 B2
(45) Date of Patent: Dec. 29, 2015

(54) OPTOELECTRONIC DEVICE WITH HOMOGENEOUS LIGHT INTENSITY

(75) Inventors: Karsten Diekmann, Rattenberg (DE); Christian Kristukat, Regensburg (DE); Benjamin Krummacher, Regensburg (DE); Steven Rossbach, Adorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/518,339

(22) PCT Filed: Dec. 20, 2010

(86) PCT No.: PCT/EP2010/070249
§ 371 (c)(1),
(2), (4) Date: Jun. 21, 2012

(87) PCT Pub. No.: WO2011/085917
PCT Pub. Date: Jul. 21, 2011

(65) Prior Publication Data
US 2012/0261712 A1    Oct. 18, 2012

(30) Foreign Application Priority Data
Dec. 21, 2009  (DE) .......................... 10 2009 055 060

(51) Int. Cl.
*H01L 51/52* (2006.01)
*H01L 51/50* (2006.01)

(52) U.S. Cl.
CPC ......... *H01L 51/5203* (2013.01); *H01L 51/5088* (2013.01); *H01L 51/5092* (2013.01); *H01L 2251/5361* (2013.01)

(58) Field of Classification Search
CPC .................. H01L 51/5203; H01L 2251/5346; H01L 51/5088; H01L 51/5092
USPC ....... 257/E33.062, 99, 40; 313/500, 506, 504
See application file for complete search history.

(56) References Cited

U.S. PATENT DOCUMENTS

| | | | | |
|---|---|---|---|---|
| 4,211,586 A | * | 7/1980 | Fang et al. | 313/500 |
| 2007/0075636 A1 | * | 4/2007 | Tobise et al. | 313/506 |
| 2008/0197371 A1 | * | 8/2008 | Ottermann | 257/98 |

FOREIGN PATENT DOCUMENTS

| | | |
|---|---|---|
| DE | 10 2005 002 836 | 8/2006 |
| DE | 10 2008 023 035 | 11/2009 |

(Continued)

OTHER PUBLICATIONS

K. Neyts et al., "Inhomogeneous luminance in organic light emitting diodes related to electrode resistivity", Journal of Applied Physics 100, 114513, pp. 114513-1 to 114513-4, 2006.

(Continued)

*Primary Examiner* — Kenneth Parker
*Assistant Examiner* — Young W Kim
(74) *Attorney, Agent, or Firm* — Cozen O'Connor

(57) ABSTRACT

An optoelectronic device comprising: a first electrical supply conductor (206); a second electrical supply conductor (212) which is connected to a first electrical terminal (104); and a functional layer (208) for emitting radiation arranged between the first electrical supply conductor (206) and the second electrical supply conductor (212), the second electrical supply conductor (212) having a lateral first electrical conductivity which changes monotonically over the extent of the second electrical supply conductor (212) away from the first electrical terminal (104).

11 Claims, 8 Drawing Sheets

(56) References Cited

FOREIGN PATENT DOCUMENTS

| | | |
|---|---|---|
| JP | 2007-123865 | 5/2007 |
| JP | 2008-529205 | 7/2008 |

OTHER PUBLICATIONS

Office Action dated May 29, 2014 issued in the corresponding Chinese Patent Application No. 201080058821.0.

* cited by examiner

OPTOELECTRONIC DEVICE WITH HOMOGENEOUS LIGHT INTENSITY

RELATED APPLICATIONS

This is a U.S. National Phase Application under 35 USC 371 of International Application PCT/EP2010/070249 filed on Dec. 20, 2010.

This application claims the priority of German Application No. 10 2009 055 060.7 filed Dec. 21, 2009, the entire content of which is hereby incorporated by reference.

FIELD OF THE INVENTION

The present invention relates to an optoelectronic device, for example an organic light-emitting diode or an electrochromic device.

BACKGROUND OF THE INVENTION

An organic light-emitting diode (OLED) is a luminescence radiator with which electromagnetic radiation is generated from electrical energy. An OLED has at least one organic active layer in which the electromagnetic radiation is generated. The active layer is arranged between an anode and a cathode. On application of a conducting-state potential, the anode injects holes into the active layer, whilst the cathode injects electrons. The injected holes and electrons each move (under the influence of an externally applied electric field) toward the electrode of opposite charge and, on recombination, generate an electroluminescent emission in the active layer.

An electrochromic device typically has a rigid carrier for an active layer which is also embedded between an anode and a cathode. If a DC voltage is applied across the anode and the cathode, a color change takes place in the active layer. For some applications, the anode, cathode and active layer are transparent. Thus the electrochromic layer can, for example, be used as a dazzle protection in a windscreen or a mirror of a motor vehicle.

A problem with such electrooptical devices is that, due to the intrinsic resistance of the anode and/or cathode, a lateral voltage falls off along the respective electrode. The lateral voltage denotes the change of the voltage away from a contact terminal of the electrode (anode or cathode). As a result, an inhomogeneous luminance pattern is formed in, for example, an OLED. In an electrochromic device, an inhomogeneous color pattern is formed. Both effects are undesirable and should be suppressed as far as possible.

SUMMARY OF THE INVENTION

It is an object of the present invention to provide an optoelectronic device in which the most homogeneous possible voltage is applied to the active layer.

Various embodiments of the optoelectronic device have a first electrical supply conductor and a second electrical supply conductor. The second electrical supply conductor is connected to the first electrical terminal. A functional layer for emitting radiation is arranged between the first electrical supply conductor and the second electrical supply conductor. The second electrical supply conductor has a first electrical conductivity which changes monotonically over the extent of the second electrical supply conductor away from the first electrical terminal.

The electrical supply conductors serve to supply and inject charge carriers into the functional layer. They often have a suitable design in the form of a sequence of layers having contacts, contact materials, inorganic or organic charge carrier transport layers, etc. They can comprise metals, for example, Ag, or metal compounds. At least one of the electrical supply conductors can be configured as a transparent supply conductor. The transparent supply conductor can comprise a transparent, conductive oxide (TCO). The TCO is conventionally a metal oxide, for example, zinc oxide, tin oxide, cadmium oxide, titanium oxide, indium oxide or indium tin oxide (ITO). As well as binary metal-oxygen compounds, which include $SnO_2$ and $In_2O_3$, the group of TCOs also includes ternary metal-oxygen compounds, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides. Furthermore, the TCOs do not necessarily represent a stoichiometric composition and can also be p-doped or n-doped in order to achieve high conductivity. The electrical supply conductors can comprise highly conductive organic materials, for example, polyethylene dioxythiophene (PE-DOT) or doped organic layers. In connection with organic conductive layers, the term "doping" can represent partial oxidation or reduction of the organic layer. It is possible that all the materials named are present, suitably combined with one another in the first or second electrical supply conductor.

In some embodiments, the functional layer comprises an organic emitter layer. The optoelectronic device therefore forms an organic electroluminescent component or an OLED.

In some embodiments, the second electrical supply conductor comprises a contact layer. In some exemplary embodiments, the contact layer can have a constant electrical sheet conductivity and a thickness of the contact layer can change monotonically over the extent of the contact layer away from the first electrical terminal. Because the contact layer usually has a constant specific resistance and thus a constant surface resistance, as the layer thickness varies, the local conductivity also varies.

In some embodiments, the second electrical supply conductor comprises a charge transport layer. The charge transport layer can comprise a doped organic semiconductor material. In some embodiments, a doping concentration of the doped organic semiconductor material changes monotonically away from the first electrical terminal. With the doping, the conductivity of the charge transport layer is simultaneously adjusted. A conductivity profile in the second electrical supply conductor is dependent on a profile of the doping concentration (doping profile) in the charge transport layer.

In some embodiments, the first electrical conductivity changes strictly monotonically away from the first electrical terminal. Conventionally, the first electrical conductivity decreases away from the second electrical terminal.

In some embodiments, the second electrical supply conductor constitutes a cathode. The first electrical conductivity corresponds to an electron conducting capacity.

In some embodiments, the first electrical supply conductor is connected to a second electrical terminal. The first electrical supply conductor has a second electrical conductivity which changes monotonically over an extent of the first electrical supply conductor away from the second electrical terminal. The first electrical supply conductor can constitute an anode. The second electrical conductivity corresponds to a hole conducting capacity.

BRIEF DESCRIPTION OF THE DRAWINGS

Various exemplary embodiments of an optoelectronic device will now be described in greater detail making reference to the drawings. In the figures, the first digit(s) of a reference sign indicates the drawing in which the reference sign is first used. The same reference signs are used for similar or identically functioning elements or properties in all the figures.

In the drawings:

FIG. 5b is a first method for manufacturing the first contact layer of FIG. 5a;

FIG. 5c is a second method for manufacturing the first contact layer of FIG. 5a;

DETAILED DESCRIPTION OF THE DRAWINGS

Figure 1:
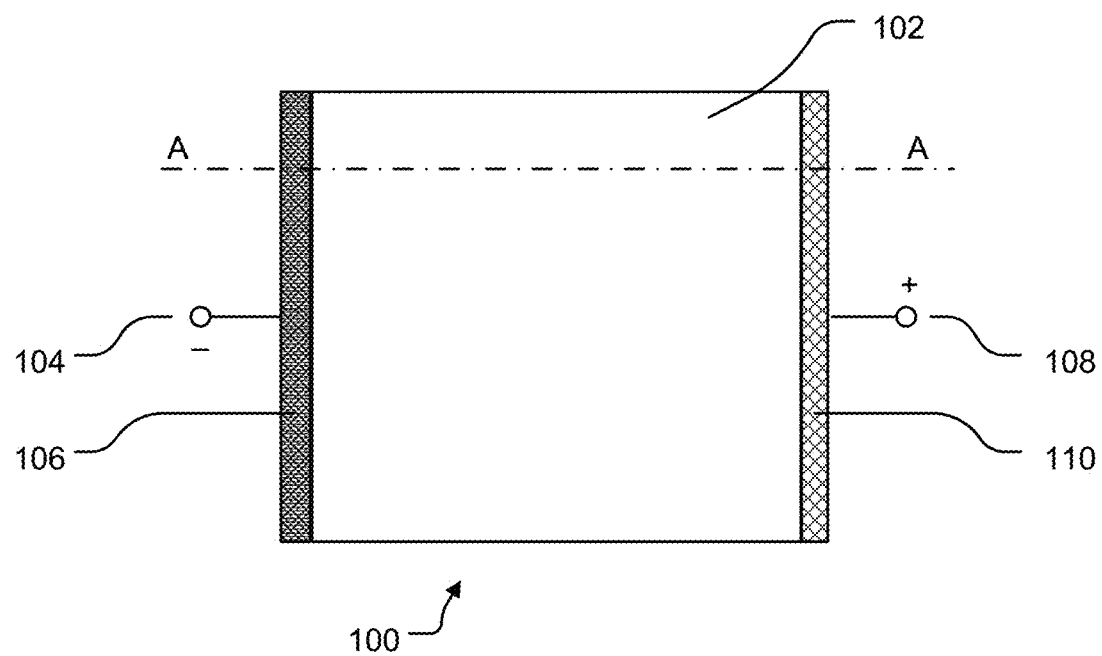
FIG. 1 is a plan view of an optoelectronic device.

FIG. 1 shows an exemplary embodiment of an optoelectronic device. The optoelectronic device 100 is, for example, an electroluminescent device. Said device has a first upper side onto which a first contact layer 102 is applied. The first contact layer 102 is connected to a first terminal 104. The connection is made with a first electrode 106 which is part of a cathode in the exemplary embodiment of the optoelectronic device 100 shown. An anode of the optoelectronic device 100 is connected to a second terminal 108 and has a second electrode 110. The second electrode 110 directly adjoins a second contact layer which covers the surface of the optoelectronic device 100 arranged opposing the first contact layer 102. The second contact layer is not shown in FIG. 1. The design of the optoelectronic device 100 will now be described in greater detail making reference to cross-sections along a section line A-A. For the sake of simplicity, the first electrode 106 and the second electrode 110 arranged opposing one another are considered to be part of the first terminal 104 and of the second terminal 108, respectively.

Figure 2:
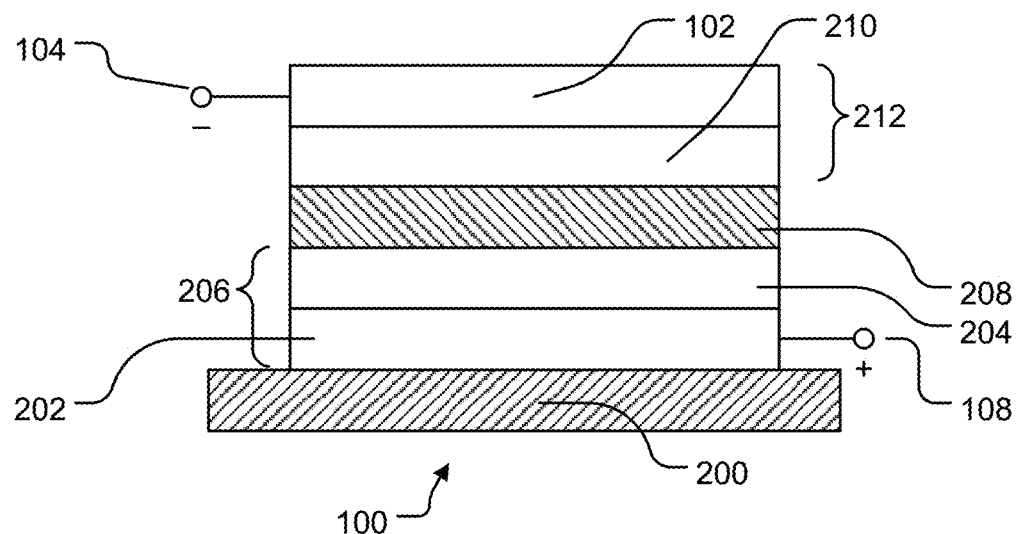
FIG. 2 is a cross-section through a known optoelectronic device of FIG. 1 along the section line A-A.

FIG. 2 shows a cross-section through a known optoelectronic device of FIG. 1 along a section line A-A. The optoelectronic device 100 has a substrate 200 onto which a sequence of layers is applied. Typically, the substrate 200 is a transparent carrier, for example, a glass or a film, for example, a flexible plastics film. A second contact layer 202 is mounted on the substrate 200. The second contact layer 202 is also transparent in the region of the radiation emitted from the optoelectronic device 100. For this purpose, the first contact layer 200 comprises a suitable transparent conductive material, for example, a transparent conductive oxide, for example, indium tin oxide (ITO). A first charge transport layer 204 is attached to the second contact layer 202. The second contact layer 202 and the first charge transport layer 204 constitute a first electrical supply conductor 206 of the optoelectronic device 100. In the exemplary embodiment shown, the first electrical supply conductor 206 is an anode of the optoelectronic device 100. The first charge transport layer 204 accordingly comprises a material with a high hole mobility.

Applied to the first electrical supply conductor 206 is a functional layer 208 in which an emitted radiation is generated as soon as an electric voltage is applied thereto. The functional layer 208 has an electroluminescent material. For example, the electroluminescent material can comprise suitable polymers for a fluorescence emission or a phosphorescence emission. Alternatively, small organic molecules which emit by means of fluorescence or phosphorescence can serve as an organic electroluminescent layer.

Applied to the functional layer 208 is a second charge transport layer 210 onto which a first contact layer 102 is applied. The second charge transport layer 210 and the first contact layer 102 constitute a second electrical supply conductor 212 of the radiation-emitting device 100. In the exemplary embodiment shown, the second electrical supply conductor 206 is a cathode of the radiation-emitting device 100.

The first electrical supply conductor 206 is connected to a second terminal 108. The second electrical supply conductor 212 is connected to a first terminal 104. The first terminal 104 and the second terminal 108 serve for the current supply to the optoelectronic device 100. For this purpose, the first terminal 104 and the second terminal 108 can be linked to an energy source. For example, said terminals are linked to a constant current source, for example, a battery or a driver circuit.

Figure 3:
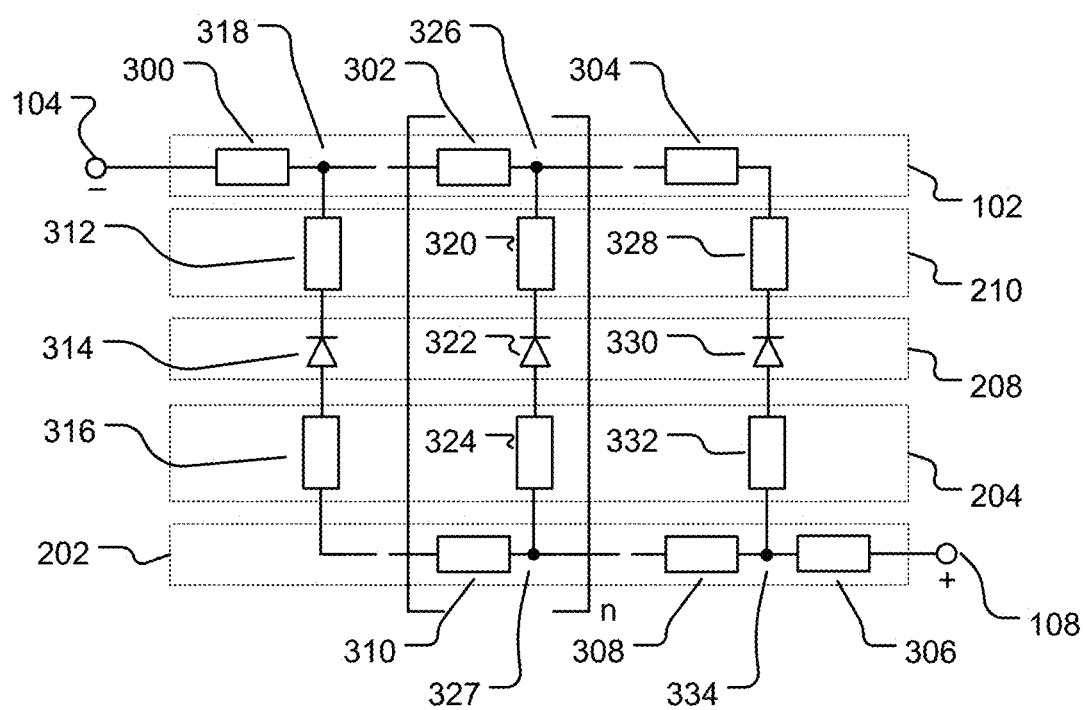
FIG. 3 is an equivalent circuit diagram of the optoelectronic device.

FIG. 3 shows an equivalent circuit diagram of the optoelectronic device 100. The first contact layer 102 essentially has a high lateral and vertical conductivity. Said layer is linked to the first terminal 104. The intrinsic resistance of the first contact layer 102 in the lateral extent thereof is represented as the series connection of a first resistor 300, a second resistor 302 and a third resistor 304. The first contact layer 102 typically comprises a metal, for example, aluminum. Said layer can also comprise a transparent conductive oxide (TCO), for example, indium tin oxide (ITO). The first resistor 300, the second resistor 302 and the third resistor 304 are modeled as ohmic resistors.

The same applies to the second contact layer 202, which is linked to the second terminal 108. The electrical conductivity of the second contact layer 202 is represented as a series connection of a fourth resistor 306, a fifth resistor 308 and a sixth resistor 310.

Between the first contact layer 102 and the second contact layer 202, the electrical currents flow essentially in the vertical direction in the optoelectronic device. In the process, they pass through the first charge transport layer 204, the functional layer 208 and the second charge transport layer 210. The first charge transport layer 204 is designated the electron transport layer (ETL). Said layer can comprise, for example, an n-doped conductive organic or inorganic material. The second charge transport layer 204 is also designated the hole transport layer (HTL). Said layer can comprise, for example, a p-doped conductive organic or inorganic material. Suitable intrinsic, i.e. undoped, layers can also be used for both charge transport layers. Usually, both charge carrier layers have an ohmic vertical resistor.

The functional layer 208 shows non-ohmic behavior. This means that there is no linear relation between a voltage (V)

applied to the functional layer 208 and a current (I) flowing through the functional layer. If the functional layer comprises, for example, a pn-junction, the behavior thereof corresponds to that of a diode, log(I) α V.

In an organic luminescence diode, the functional layer 208 comprises, for example, an organic electroluminescent material which emits light on application of a potential. The organic electroluminescent material is, for example, a polymer. Small organic molecules which emit by means of fluorescence or phosphorescence can also serve as an organic electroluminescent material. In this case, charge transport takes place via hopping processes or tunneling processes. The relation between the voltage (V) applied and the current I flowing through the functional layer 208 can be described according to the I-V characteristic of an electron tube, i.e. I α $V^{2/3}$.

According to these properties of the various layer planes of the optoelectronic device, the optoelectronic device can be represented in the vertical direction as a series connection of an ohmic resistor, a non-linear element, such as a diode, and a further ohmic resistor. Due to the lateral extent of the optoelectronic device, the current can be modeled in the vertical direction as a parallel connection of a plurality of such series connections.

Accordingly, in FIG. 3, a first current path is shown, which comprises a series connection of a seventh resistor 312, a first diode 314 and an eighth resistor 316. The first current path connects a node 318 arranged between the first resistor 300 and the second resistor 302 to the sixth resistor 310. Connected in parallel thereto is a second current path which comprises a series connection of a ninth resistor 320, a second diode 322 and a tenth resistor 324. The second current path connects a second node 326 arranged between the second resistor 302 and the third resistor 304 to a third node 327 arranged between the sixth resistor 310 and the fifth resistor 308. The parallel circuit is completed by a third current path which comprises a series connection of an eleventh resistor 328, a third diode 330 and a twelfth resistor 332. The third current path connects the third resistor 304 to a node 334 arranged between the fifth resistor 308 and the fourth resistor 306.

It is indicated in FIG. 3 that the equivalent circuit diagram can be improved by multiple (n-fold) repetition of the second current path. Ultimately, a current density model of this type is reproduced with specific conductivities.

In the known optoelectronic device shown in FIG. 2, all the layers capable of conducting have a constant conductivity over the lateral extent thereof. Accordingly, the resistor values of the first resistor 300, the second resistor 302 and the third resistor 304 are identical. The resistance values of the fourth resistor 306, the fifth resistor 308 and the sixth resistor 310 are also identical.

The materials of the first contact layer 102 and the second contact layer 202 are frequently identical in the case of a transparent optoelectronic device, so that the specific conductivity does not differ. In a number of other applications, however, the materials differ. In this case, the specific conductivities and thus also, usually, the resistance value of the first resistor 300 or the second resistor 302 and the third resistor 304 differ from the resistance value of the fourth resistor 306 or the fifth resistor 308 and the sixth resistor 310.

The first charge transport layer 210 and the second charge transport layer 204 usually have different dopings and thus also different conductivities from one another. It can be taken into account that usually available materials are used in which a hole transport layer has a significantly greater hole mobility than the electron mobility of the electron transport layers used. However, in the case of the known optoelectronic device of FIG. 2, in each layer the respective conductivity is constant in the lateral extent, so that the seventh resistor 312, the ninth resistor 320 and the eleventh resistor 328 have the same resistance value. The eighth resistor 316, the tenth resistor 324 and the twelfth resistor 332 also have the same resistance value. The functional layer 208 also has a homogeneous electrical conductivity so that the characteristic lines of the first diode 314, the second diode 322 and the third diode 330 are identical.

The optoelectronic device shown in FIG. 2 therefore has a homogeneous structure with regard to the electrical properties thereof. As a consequence, given a constant current applied via the first terminal 104 and the second terminal 108, a voltage drop comes into existence along the lateral extent of the optoelectronic device. This effect is described, for example, in document [1]. Therefore, in the case of an OLED, a non-uniform, that is, inhomogeneous luminance pattern is produced.

How the optimally homogeneous luminance pattern is achieved will now be demonstrated with individual exemplary embodiments. All the exemplary embodiments described such aim to achieve the most homogeneous possible vertical voltage distribution at the functional layer 208.

Figure 4:
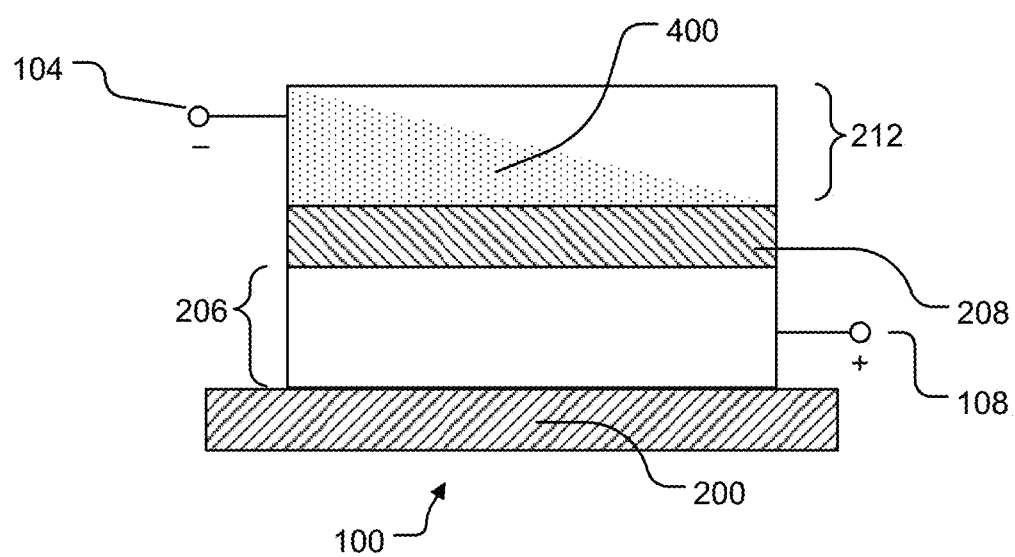
FIG. 4 is a cross-section through a first exemplary embodiment of the optoelectronic device of FIG. 1 along the section line A-A.

FIG. 4 shows a cross-section through a first exemplary embodiment of the optoelectronic device 100 of FIG. 1 along the section line A-A. The first exemplary embodiment differs from the known device of FIG. 2 in that the second electrical supply conductor 212 has a progression of conductivity 400 away from the first terminal 104. The conductivity 400 decreases with increasing distance from the first terminal. Preferably, a particularly homogeneous luminance can be achieved by means of a linear decrease in conductivity.

Figure 5A:
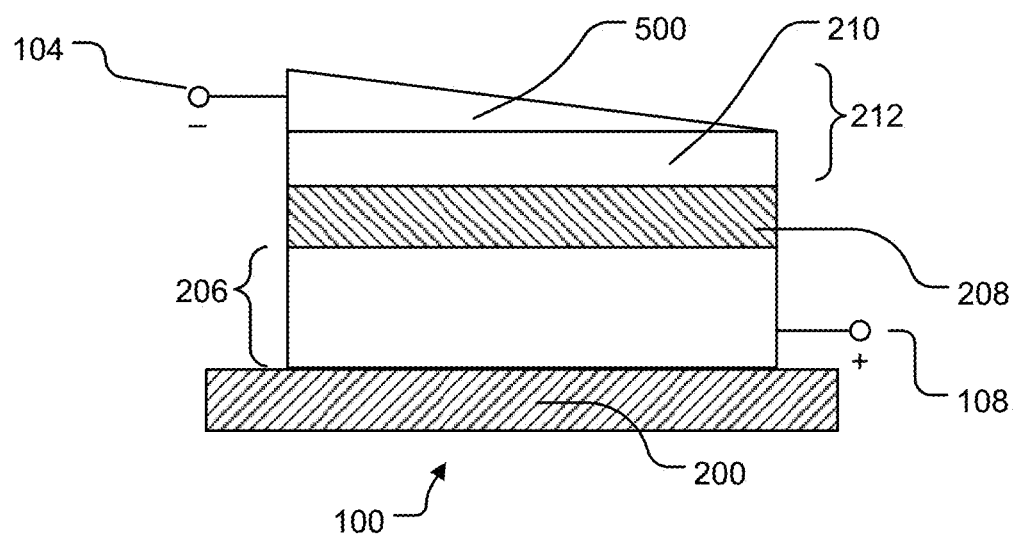
FIG. 5a is a first embodiment of the first exemplary embodiment of FIG. 4.

This can be achieved, for example, in that a progression of the lateral conductivity is provided in the first contact layer. In the context of the equivalent circuit diagram of FIG. 3, for example, a resistance value $R_1$ of the first resistor 300 is smaller than a resistance value $R_2$ of the second resistor 302, where $R_2$ is, in turn, smaller than a resistance value $R_3$ of the third resistor 304. Thus the conductivity has a strictly monotonically declining progression 400 away from the first terminal 104. This can be achieved, for example, by a suitable selection of the layer thickness of the first contact layer. An exemplary embodiment of this type is shown in FIG. 5a. The structure is essentially that of FIG. 2, but with a first contact layer 500 the thickness D of which decreases away from the first terminal 104. Since the first contact layer 500 is made from a homogeneous material which has a constant specific conductivity ρ, the layer resistance $R_{sq}=ρ/D$ increases away from the first terminal 104. A layer thickness profile of this type can be generated by a plurality of methods. For example, the first contact layer 500 can be generated using a plurality of masks. In this way, a stepped progression of the layer thickness could be created. The first contact layer 500 can also be created by means of a coating process or by a vapor-deposition process. Different layer thickness profiles can thus be created by inclined deposition or different intensities of vapor deposition. It is also conceivable for the first contact layer 500 to be created in a printing process, for example, screen printing with suitable printing masks. Also on printing with organic materials during heating of the printed layer, the layer thickness profile can be suitably selected by means of defined temperature profiles.

Figure 5B:
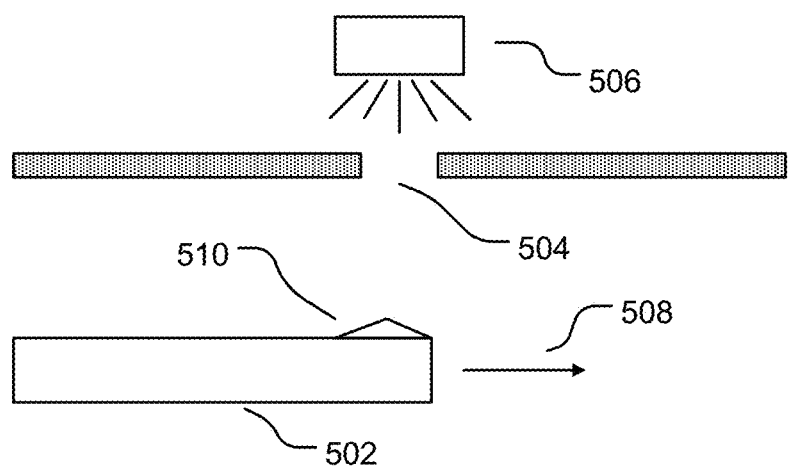
Figure 5C:
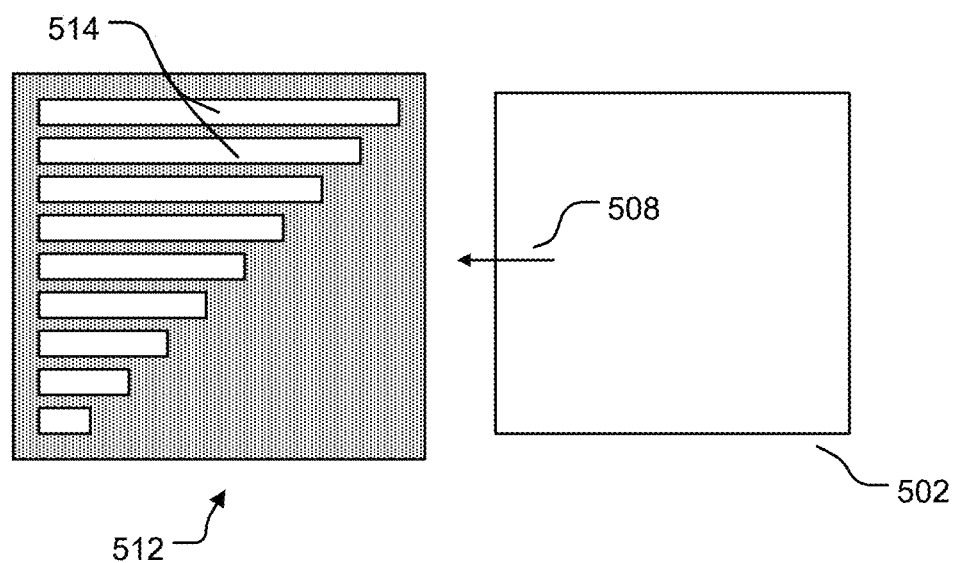

In FIGS. 5b and 5c, two methods for applying the first contact layer 500 are shown by way of example. FIG. 5b shows a first method for applying a first contact layer 500 onto a layer stack 502. For this purpose, the layer stack 502 is guided under an aperture 504. The aperture 504 extends in the form of a slit in the depth direction of the representation of FIG. 5b, wherein the layer stack 502 and the aperture 504 are shown in cross-section. In the depth extent, the aperture 504 has approximately the length of the depth of the layer stack 502. The aperture 504 is arranged between a material source 506 and the layer stack 502. Material for producing the first contact layer is emitted from the material source 506, for example, by vaporization, and passes through the aperture 504 onto a surface of the layer stack 502. The layer stack 502 is guided along under the aperture and is moved parallel to the aperture 502 in a horizontal direction 508. The material emitted from the material source 506 is deposited onto the portion of the surface situated under the aperture 504 and thus forms a section 510. The local thickness of a region of the section 510 is determined by the time for which the region is exposed to the material source 506. If this time is varied, different thicknesses can be achieved. In order to achieve a laterally increasing progression in the thickness of the first contact layer 500, the layer stack is moved past the aperture 504 with an accelerating (i.e. constantly faster) or constantly slower movement. If the movement is decelerated, the thickness of the first contact layer increases in regions which were last exposed to the material source 506, as indicated in FIG. 5b. If the movement is accelerated, then a thicker profile of the first contact layer 500 is formed in the initially deposited regions, decreasing toward the later deposited regions.

A second method for applying the first contact layer 500 is illustrated by FIG. 5c. The drawing shows a plan view of an aperture system. The aperture system has an aperture plate 512. The aperture plate 512 has a plurality of aperture slits 514. The aperture slits 514 each have a different length. By means of the aperture slits 514, material emerging from a material source (for clarity, not shown in FIG. 5c) can pass through the aperture system 512. The layer stack 502 is guided underneath the aperture system 512 at a constant speed. A quantity of the material which is dependent on the length of each aperture slit passes through the aperture slits 514 onto the surface of the layer stack 502 and thereby forms a contact layer 500 which has a thickness profile which varies continuously in the direction of a longitudinal extent.

On implementation of the second method, a material source is provided which provides a homogeneous material flux over the entire surface of the aperture system 512. It is also conceivable to provide, via or in place of, the aperture system 512, a system of relatively small material sources. With this, via an aperture slit or in place of relatively long aperture slits, a relatively large number of relatively small material sources and, via or in place of, relatively short aperture slits, a relatively small number of material sources is provided.

With regard to all methods, a relative movement between the material source and the aperture system or the aperture and the layer stack is necessary. It should be understood that it is sufficient to move one of the components in order to obtain a vertical layer thickness profile.

Figure 6:
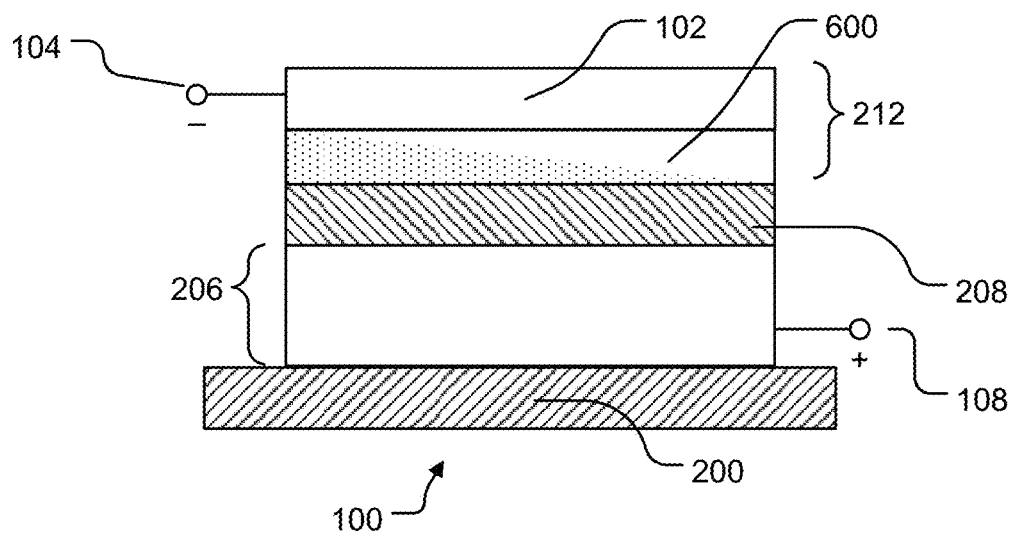
FIG. 6 is a second embodiment of the first exemplary embodiment of FIG. 4.

In addition or alternatively to the exemplary embodiment shown in FIG. 5a, the horizontal conductivity of the second electrical supply conductor 212 can decrease monotonically away from the first terminal 104. The conductivity of the second charge transport layer essentially contributes thereto. The second charge transport layer is, for example, an n-doped material. The lateral progression of the conductivity can, as shown in FIG. 6 in contrast to the structure of FIG. 2, be influenced in that a second charge transport layer 600 is provided which has a doping profile which varies away from the first terminal, the concentration of doping substances continuously decreasing away from the first terminal 104. In the equivalent circuit diagram of FIG. 3, therefore, a resistance value $R_7$ of the seventh resistance 312 is smaller than a resistance value $R_9$ of the ninth resistor 320, $R_9$ being smaller than a resistance value $R_{11}$ of the eleventh resistor 328. When the charge transport layer is manufactured, the local doping concentration can be adjusted by a number of methods. Thus, typically, relatively large intermediate products are exposed to a particle flux from a doping source. By means of the speed with which the intermediate product passes through the active cross-section or by means of a change in the temperature of the doping source, the total dose and thus also the absorbed dopant concentration in the intermediate product is influenced. Similarly, with relatively small workpieces, screens and relatively small filter masks are conceivable in order to influence the dopant dose.

The measures shown in FIGS. 5a and 6 can suitably be combined. In effect, the voltage applied to the functional layer 208 is determined by the charge carriers supplied via the first terminal 104 and the second terminal 108. Although a large electron flow can be brought about close to the first terminal 104 due to the higher conductivities of the second electrical supply conductor 212, the actual current remains limited by the supply of holes on the anode side. By contrast with this, the electron flux close to the anode terminal, that is, the second terminal 108 is restricted by the lower conductivity. The luminance close to the first terminal 104 and close to the second terminal 108 is reduced by the limited charge carrier flux. Overall, therefore, the luminance pattern appears more homogeneous.

Figure 7:
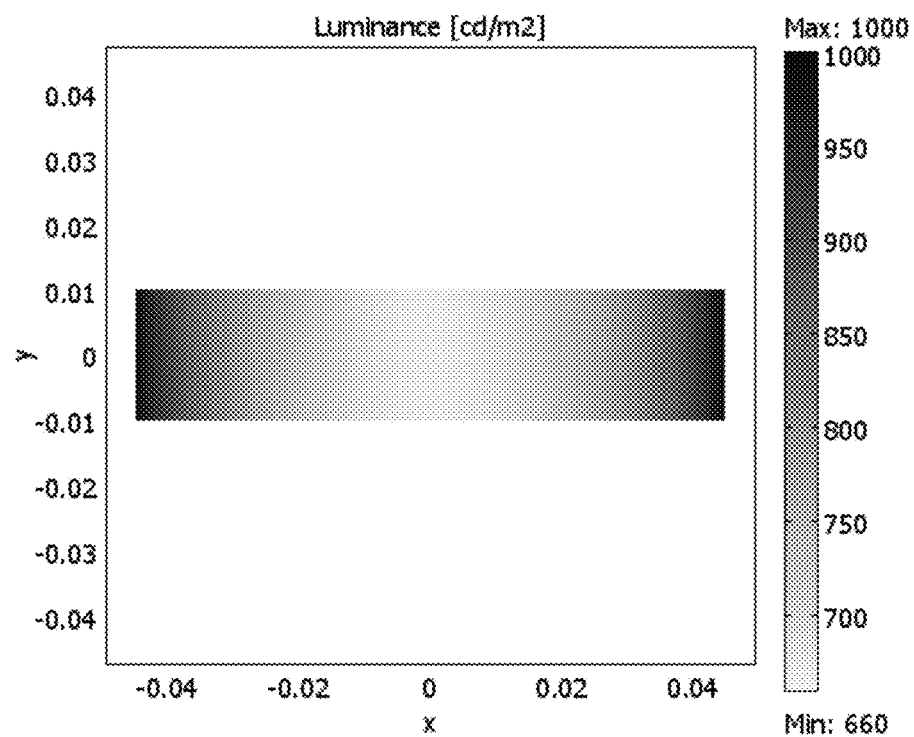
FIG. 7 is a simulation of the luminance distribution of the known optoelectronic device of FIG. 2.
Figure 8:
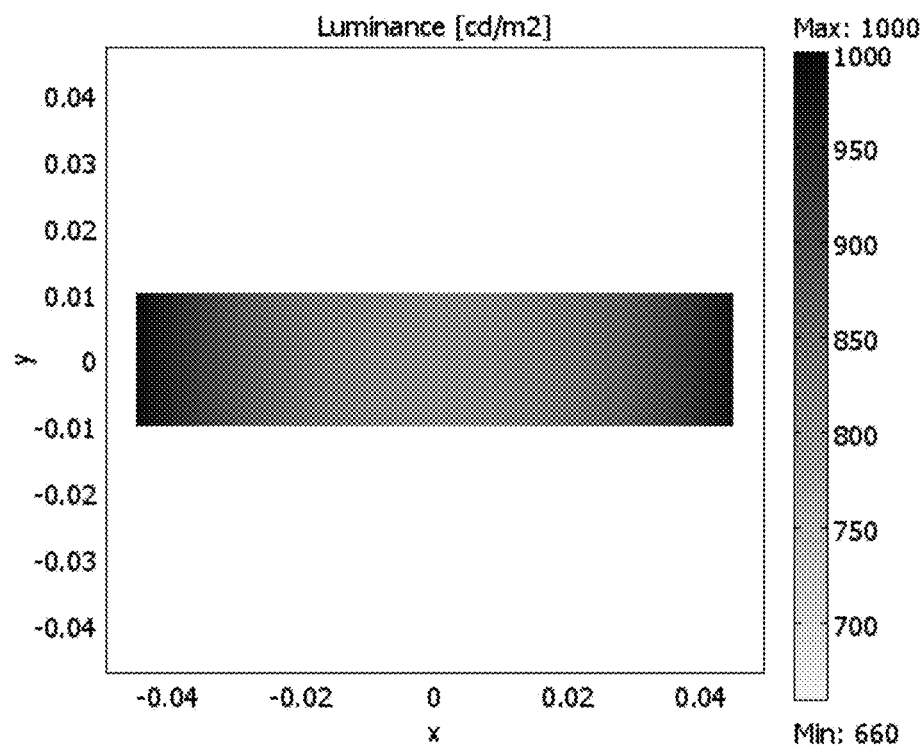
FIG. 8 is a simulation of the luminance distribution of the first exemplary embodiment of the optoelectronic device of FIG. 4.

It is shown in FIGS. 7 and 8 that a homogeneous luminance pattern is achieved with the measures described. FIG. 7 shows a simulation of the brightness distribution of the known optoelectronic device of FIG. 2. Shown in the form of a gray scale is the luminance distribution in $cd/m^2$ on a surface of an electroluminescent device. The abscissa (x-axis) denotes the distance between a cathode terminal on the left-hand side and an anode terminal on the right-hand side. The ordinate (y-axis) denotes the distance along the terminals (cf. the representation in FIG. 1). The simulation makes it apparent that the luminance in the center between the terminals is significantly lower than close to one of the terminals. The scales of the distance and the luminance have been selected for the simulation and should therefore be understood to be purely exemplary.

By way of a comparison therewith, FIG. 8 is a simulation of the luminance distribution of the first exemplary embodiment of the optoelectronic device of FIG. 4. A representation comparable to FIG. 7 has been chosen. It is clear from the comparison that the luminance of the first exemplary embodiment appears significantly more homogeneous than the luminance of the known optoelectronic device.

Figure 9:
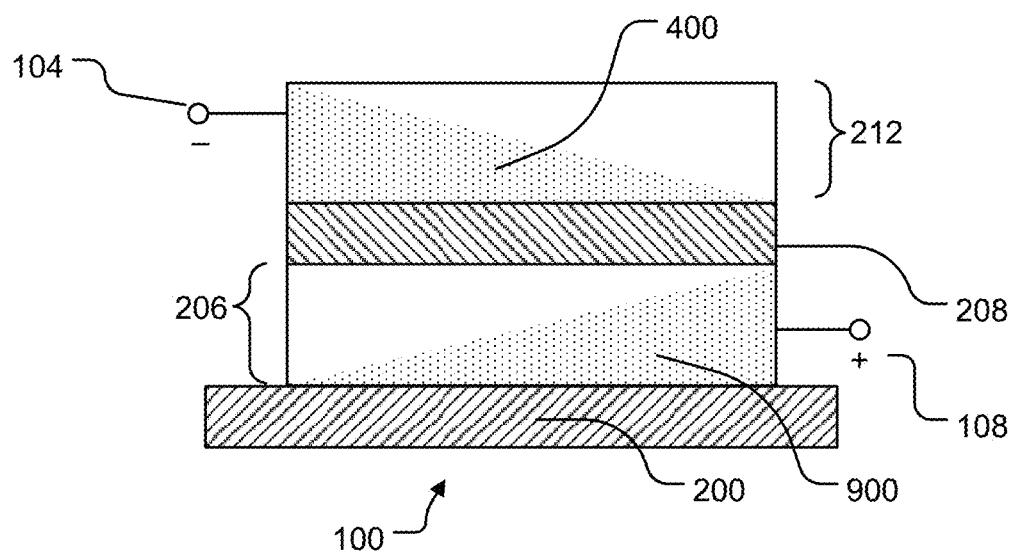
FIG. 9 is a cross-section through a second exemplary embodiment of the optoelectronic device according to FIG. 1 along the section line A-A.

FIG. 9 shows a cross-section through a second exemplary embodiment of an optoelectronic device 100 of FIG. 1 along the section line A-A. The second exemplary embodiment differs from the first exemplary embodiment in that the first electrical supply conductor 206 has a progression of the conductivity 900 away from the second terminal 108. The conductivity 900 decreases with distance away from the first terminal. Insofar as the second terminal 108 is an anode, the conductivity is taken to mean hole conducting capacity. Similarly to the conductivity of the second electrical supply conductor 212, the conductivity can be locally adjusted by varying the thickness of the second contact layer and/or by selecting the doping concentration in the first charge transport layer.

A conductivity profile is therefore also provided in the anode. Overall, the inflow of charge carriers can thus be controlled on both contact sides of the functional layer 208. Since the hole conducting capacity would usually be higher than the electron conducting capacity, this measure is advantageous, particularly in addition to an adjustment of the electron conducting capacity.

Optoelectronic Device with Offset Electrodes

Figure 10:
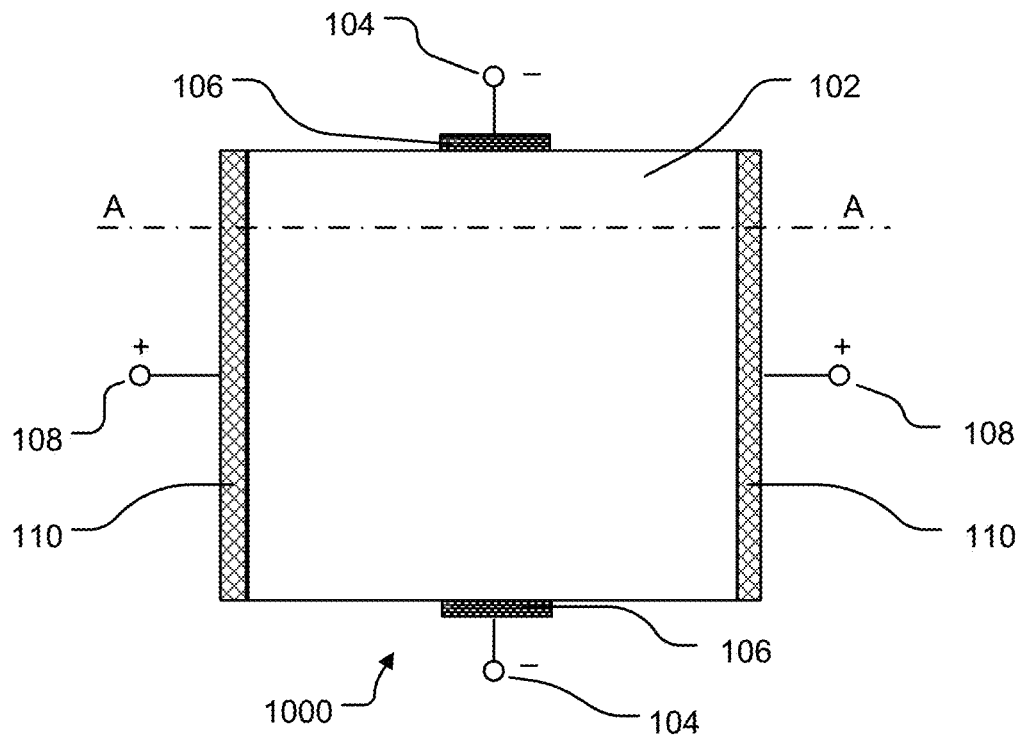
FIG. 10 is a plan view of a second optoelectronic device.

FIG. 10 shows a plan view of a second optoelectronic device 100. It is evident from the plan view that the second optoelectronic device 1000 differs from the first optoelectronic device in that the second electrode 110 is arranged with a partial region on each of two opposing side edges of the second optoelectronic device 1000. The first electrode 106 is arranged with a partial region on each of the two other also opposing side edges. As a result, a current density profile through the body of the optoelectronic device is produced that is different from the current density of the first optoelectronic device.

Figure 11:
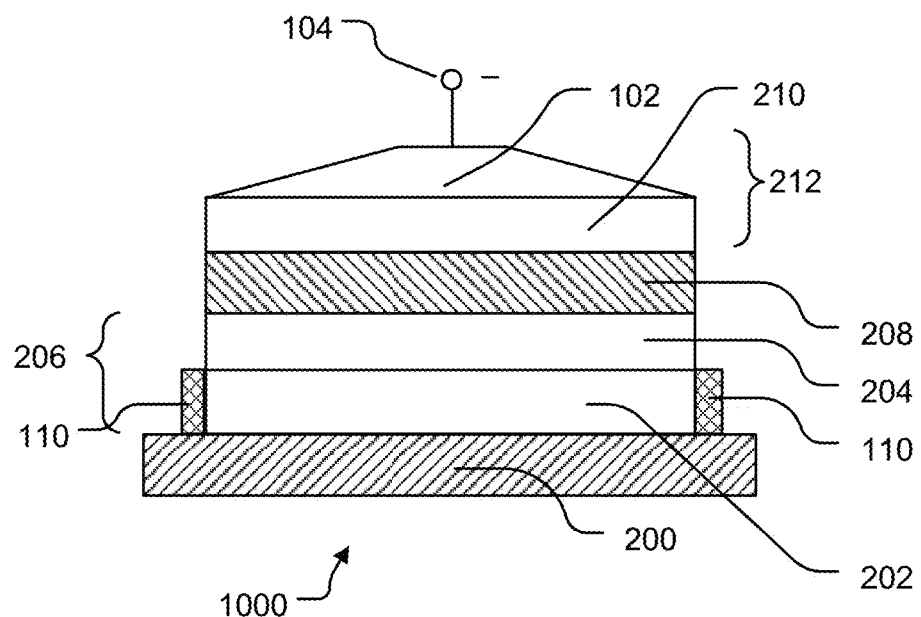
FIG. 11 is a cross-section through the second optoelectronic device of FIG. 10 along a section line A-A.

The design of the second optoelectronic device 1000 is made clearer by FIG. 11. FIG. 11 shows a cross-section through an exemplary embodiment of the second optoelectronic device 1000 along the section line A-A. A first electrical supply conductor 206 is applied to a substrate 200. As in the case of the first optoelectronic device, said electrical supply conductor has a second contact layer 202 and a first charge transport layer 204. Said layers each comprise materials as described in connection with the first optoelectronic device. The second contact layer 202 is electrically connected to the second electrode 110 which contacts said contact layer from two sides.

Applied to the first electrical supply conductor 206, as in the case of the first optoelectronic device, is a functional layer 208 which is covered by a second electrical supply conductor 212. The second electrical supply conductor 212 comprises a second charge transport layer 210 and a first contact layer 102. The first contact layer 102 is contacted by the first electrode 106, as is made clear in conjunction with the representation of FIG. 10. In the axis between the two partial members of the first electrode, said contact layer has a constant thickness and thus a constant conductivity, which decreases continuously from this region toward the side edges. It is also conceivable that the first contact layer 102 has a homogeneous layer thickness and that, for example, the second charge carrier layer 210 has a corresponding doping profile instead. The selection of the doping profile is made clear in combination with the exemplary embodiment of FIG. 6. What is important is that the conductivity of the second electrical supply conductor decreases toward the regions that are geometrically closer to the second electrode 110.

It is a fundamental concept that, dependent on the arrangement and the geometry of the first electrode 106 and the second electrode 110, the second electrical supply conductor 212 (and similarly also the second electrical supply conductor 206) is configured such that the charge carrier conductivity of the respective electrical supply conductor decreases away from the corresponding electrode toward the electrode with the opposite polarity.

Optoelectronic Device with Circular Electrode

Figure 12:
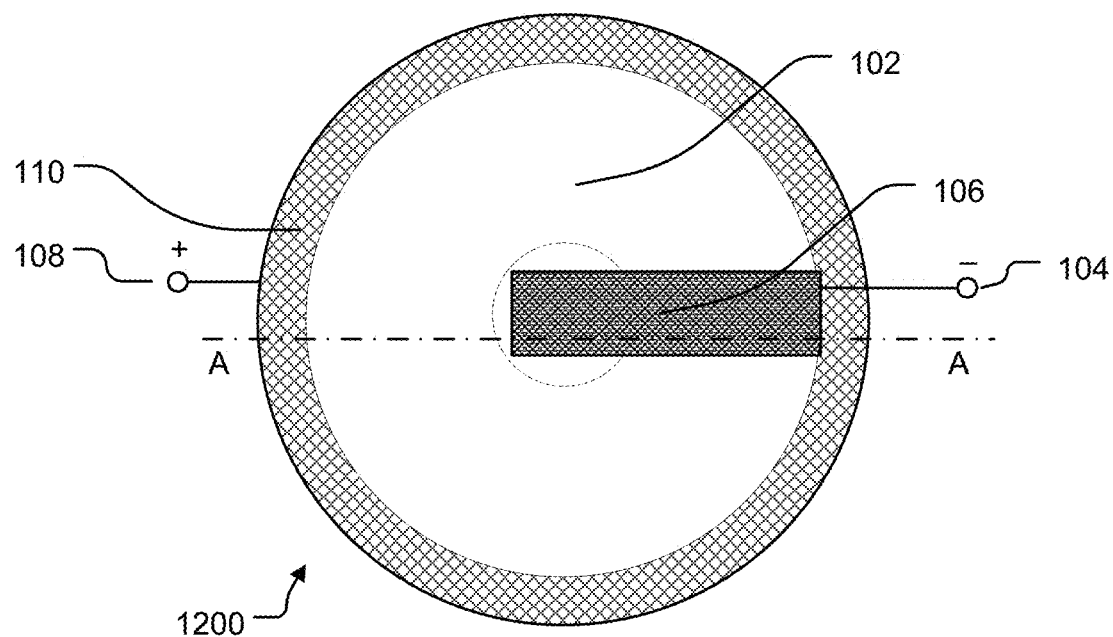
FIG. 12 is a plan view of a third optoelectronic device.

A further optoelectronic device with a further electrode structure will now be described by reference to a third optoelectronic device. FIG. 12 shows a plan view of the third optoelectronic device 1200. In order to make the representation clearer, an encapsulation which is usually applied to this side is not shown.

The optoelectronic device 1200 is an electroluminescent device. Said device has a first upper side onto which a first contact layer 102 is applied. The first contact layer 102 is connected to a first terminal 104. The connection is made via a first electrode 106 which is part of a cathode in the exemplary embodiment of the optoelectronic device 1200 shown. The first electrode 106 is mounted on the first contact layer 102. An anode of the optoelectronic device 1200 is connected to a second terminal 108 and comprises a second electrode 110. The second electrode 110 is configured as a circular electrode and directly adjoins a second contact layer which covers the surface of the optoelectronic device 1200 opposing the first contact layer 102. The structure of the optoelectronic device 1200 and the arrangement of the electrodes will now be described in greater detail on the basis of a cross-section along a section line A-A.

Figure 13:
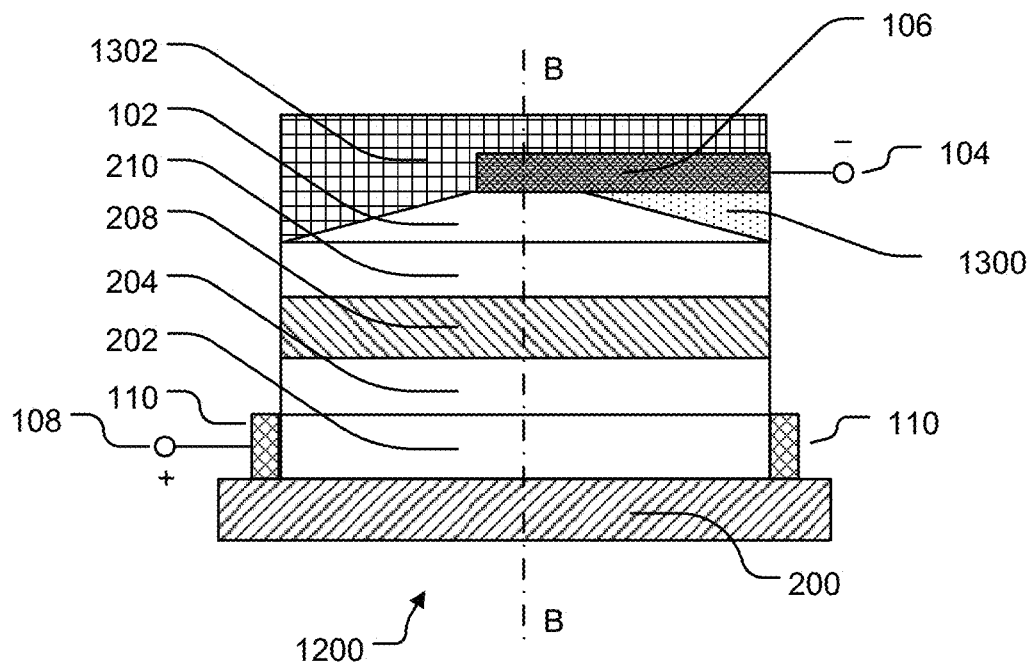
FIG. 13 is a cross-section through the third optoelectronic device of FIG. 12 along a section line A-A.

FIG. 13 shows a cross-section through the third optoelectronic device of FIG. 12 along a section line A-A. This cross-section shows that the third optoelectronic device 1300 differs from the first and second optoelectronic device in the arrangement and geometry of the electrodes. The third optoelectronic device 1300 has a substrate 200 onto which a second contact layer 202 is applied. The second contact layer 202 is surrounded in circular manner by the second electrode 110. The second electrode 110 is connected to the second terminal 108. A first charge transport layer 204 is applied to the second contact layer 202. A functional layer 208 is arranged between the first charge transport layer 204 and a second charge transport layer 210. The first contact layer 102 is arranged on the second charge transport layer 210. The first contact layer 102 has a central region which has a constant thickness in a region around the vertical symmetry axis B-B. The layer thickness of the first contact layer decreases away from this region toward the outer sides and thus toward the vicinity of the circular electrode, that is, toward the second electrode 110. In this arrangement, the lateral progression of the conductivity is equivalent to a radial progression. In the central region of the first contact layer 102, the first electrode 106 contacts said central region. Outside the central region, the first electrode 106 is electrically insulated from the first contact layer 102 by a passivation layer 1300.

An encapsulation 1302 (not shown in FIG. 12) is applied to the first contact layer 102 and the electrode 106. Said encapsulation serves to protect the layer sequence and comprises, for example, a passivation layer, a plastics material or the like.

In order to apply the first contact layer 102 onto the remaining layer stack, various manufacturing methods can be used. It is conceivable, for example, to use a type of "spin-on" method wherein the material of the first contact layer 102 is applied centrally through an aperture onto a rotating layer stack. It is also conceivable for a source to emit the material via an aperture or a system of concentric apertures onto a stack layer such that the material impacts the surface of the layer stack at a bell-shaped rate. A rotation of the stack layer during vapor deposition can contribute to an even configuration of the first contact layer 102 with rotational symmetry. It is also conceivable to provide, for example, a rotating material source or a rotating aperture system.

The optoelectronic device has been described in order to illustrate the underlying concept by means of some exemplary embodiments. The exemplary embodiments are not restricted to particular combinations of features. Even if some features and configurations have only been described in relation to a particular exemplary embodiment or individual exemplary embodiments, they can each be combined with other features of other exemplary embodiments. It is equally possible to omit individual features disclosed in exemplary embodiments or to omit or include particular configurations, provided the general technical teaching is still realized.

The invention claimed is:

1. An optoelectronic device comprising:
a first electrical supply conductor layer electrically directly connected to a first electrical terminal, the first electrical supply conductor comprising a first contact layer and a first charge transport layer electrically directly connected to the first contact layer, the first electrical terminal being electrically directly connected to the first contact layer on a first side of the optoelectronic device;
a second electrical supply conductor layer electrically directly connected to a second electrical terminal, the second electrical supply conductor comprising a second contact layer and a second charge transfer layer electrically directly connected to the second contact layer, the second electrical terminal being electrically directly connected to the second contact layer on a second side of the optoelectronic device opposite the first side of the optoelectronic device so that electric current flowing between the first electrical terminal and the second electrical terminal flows essentially laterally through the first and second contact layers; and
a functional layer for emitting radiation, the functional layer being positioned between the first electrical supply conductor and the second electrical supply conductor,
wherein the second contact layer has a lateral electrical resistance which changes monotonically over a lateral extent of the second contact layer away from the second electrical terminal, and
wherein the first electrical terminal is electrically directly connected to one lateral end of the first contact layer, the lateral end of the first contact layer being on the first side of the optoelectronic device, and wherein the second electrical terminal is electrically directly connected to one lateral end of the second contact layer, the lateral end of the second contact layer being on the second side of the optoelectronic device.

2. The optoelectronic device of claim 1, wherein the functional layer comprises an organic emitter layer.

3. The optoelectronic device of claim 1, wherein a thickness of the second contact layer changes monotonically over the extent of the contact layer away from the second electrical terminal.

4. The optoelectronic device of claim 1, wherein the lateral electrical resistance of the second contact layer changes strictly monotonically away from the second electrical terminal.

5. The optoelectronic device of claim 1, wherein the second electrical supply conductor constitutes a cathode.

6. An optoelectronic device comprising:
a first electrical supply conductor layer electrically directly connected to a first electrical terminal, the first electrical supply conductor comprising a first contact layer and a first charge transport layer electrically directly connected to the first contact layer, the first electrical terminal being electrically directly connected to the first contact layer on a first side of the optoelectronic device;
a second electrical supply conductor layer electrically directly connected to a second electrical terminal, the second electrical supply conductor comprising a second contact layer and a second charge transfer layer electrically directly connected to the second contact layer, the second electrical terminal being electrically directly connected to the second contact layer on a second side of the optoelectronic device opposite the first side of the optoelectronic device so that electric current flowing between the first electrical terminal and the second electrical terminal flows essentially laterally through the first and second contact layers; and
a functional layer for emitting radiation, the functional layer being positioned between the first electrical supply conductor and the second electrical supply conductor,
wherein the second contact layer has a lateral electrical resistance which changes monotonically over a lateral extent of the second contact layer away from the second electrical terminal, wherein the first electrical supply conductor has a lateral electrical resistance which changes monotonically over a lateral extent of the first electrical supply conductor away from the first electrical terminal.

7. The optoelectronic device of claim 6, wherein the first electrical supply conductor constitutes an anode.

8. The optoelectronic device of claim 6, wherein the functional layer comprises an organic emitter layer.

9. The optoelectronic device of claim 6, wherein a thickness of the second contact layer changes monotonically over the extent of the contact layer away from the second electrical terminal.

10. The optoelectronic device of claim 6, wherein the lateral electrical resistance of the second contact layer changes strictly monotonically away from the second electrical terminal.

11. The optoelectronic device of claim 6, wherein the second electrical supply conductor constitutes a cathode.

* * * * *